United States Patent
Seshadri et al.

(10) Patent No.: US 9,139,688 B2
(45) Date of Patent: Sep. 22, 2015

(54) COPOLYMERS OF 3,4-DIALKOXYTHIOPHENES AND METHODS FOR MAKING AND DEVICES

(75) Inventors: Venkataramanan Seshadri, Pittsburgh, PA (US); Elena E. Sheina, Pittsburgh, PA (US)

(73) Assignee: SOLVAY USA, INC., Cranbury, NJ (US)

( * ) Notice: Subject to any disclaimer, the term of this patent is extended or adjusted under 35 U.S.C. 154(b) by 346 days.

(21) Appl. No.: 13/516,213

(22) PCT Filed: Dec. 17, 2010

(86) PCT No.: PCT/US2010/061024
§ 371 (c)(1),
(2), (4) Date: Oct. 1, 2012

(87) PCT Pub. No.: WO2011/075644
PCT Pub. Date: Jun. 23, 2011

(65) Prior Publication Data
US 2013/0023621 A1    Jan. 24, 2013

Related U.S. Application Data

(60) Provisional application No. 61/287,977, filed on Dec. 18, 2009.

(51) Int. Cl.
| | | |
|---|---|---|
| *C08G 61/12* | (2006.01) | |
| *C09K 11/06* | (2006.01) | |
| *H01B 1/12* | (2006.01) | |
| *H01L 51/00* | (2006.01) | |
| *H05B 33/14* | (2006.01) | |

(52) U.S. Cl.
CPC ............. *C08G 61/126* (2013.01); *C09K 11/06* (2013.01); *H01B 1/127* (2013.01); *H01L 51/0036* (2013.01); *H01L 51/0037* (2013.01); *H01L 51/0043* (2013.01); *H05B 33/14* (2013.01); *C09K 2211/1491* (2013.01); *Y02E 10/549* (2013.01)

(58) Field of Classification Search
CPC .... C08F 228/06; C08G 61/126; C09K 11/06; C09K 2211/1491; H01B 1/127; H01L 51/0036; H01L 51/0037; H01L 51/0043
USPC ......................................................... 524/547
See application file for complete search history.

(56) References Cited

U.S. PATENT DOCUMENTS

| | | | |
|---|---|---|---|
| 2006/0237695 A1* | 10/2006 | Williams et al. | 252/500 |
| 2010/0265562 A1* | 10/2010 | Reynolds et al. | 359/275 |
| 2010/0298527 A1* | 11/2010 | Beaujuge et al. | 528/380 |

FOREIGN PATENT DOCUMENTS

| | | |
|---|---|---|
| WO | WO 2009/058877 A1 | 5/2009 |
| WO | WO 2009/120658 A1 | 10/2009 |

OTHER PUBLICATIONS

Udayakumar et al. "Synthesis and characterization of fluorescent poly(oxadiazole)s containing 3,4-dialkoxythiophenes", Organic Chemistry Lab, Department of Chemistry, National Institute of Technology Karnataka, Surathkal, P.O Srinivasnagar, D.K, 575 025, India, Optical Materials (Amsterdam, Netherlands) (2007), 29(12), 1710-1718.*

Udayakumar, D. et al, "Synthesis and characterization of fluorescent poly(oxadiazole)s containing 3,4- dialkoxythiopehenes," Optical Materials, vol. 29, No. 12, Jun. 23, 2007, pp. 1710-1718, XP022126843.

International Search Report and Written Opinion mailed Aug. 16, 2011 in International Application No. PCT/US2010/061024.

* cited by examiner

*Primary Examiner* — Michael M Bernshteyn
(74) *Attorney, Agent, or Firm* — The Marbury Law Group, PLLC

(57) ABSTRACT

Copolymers of 3,4-dialkoxythiophenes are disclosed that are useful as electronics materials. Also disclosed are methods of making these copolymers, as well as compositions and devices incorporating them. Use of these materials in hole injection or hole transport layers is disclosed. Materials comprising these copolymers can be designed to provide solubility in some solvents and intractability in others, which is useful for the construction of multilayer materials for use in electronic devices.

18 Claims, No Drawings

COPOLYMERS OF 3,4-DIALKOXYTHIOPHENES AND METHODS FOR MAKING AND DEVICES

RELATED APPLICATIONS

This application claims priority to U.S. Provisional Ser. No. 61/287,977 filed Dec. 18, 2009, which is hereby incorporated by reference in its entirety.

BACKGROUND

Although useful advances are being made in energy saving devices such as organic-based organic light emitting diodes (OLEDs) and organic photovoltaic devices (OPVs), further improvements are still needed in providing better processing and performance. For example, one promising type of material is conducting polymers including, for example, polythiophenes. However, problems can arise with doping, purity, solubility, and processing. In particular, it is important to have a very good control over the solubility of alternating layers of polymer (e.g., orthogonal or alternating solubility properties among adjacent layers). In particular, hole injection layers and hole transport layers can present difficult problems in view of competing demands and the need for very thin, but high quality, films.

A need exists for a good platform system to control properties of hole injection and transport layers such as solubility and electronic energy levels such as, for example, HOMO and LUMO so that the materials can be adapted for different applications and to function with different materials such as light emitting layers, photoactive layers, and electrodes. In particular, good solubility and intractability properties are important. The ability to formulate the system for a particular application and provide the required balance of properties are also important.

As production processes for these materials are scaled-up, there is also a growing need to improve the methods for making these materials. In particular, there is a need for methods to decrease yield losses of comonomers during their purification. Furthermore, there is a need for methods to allow copolymerization without use of highly reactive comonomers.

SUMMARY

Embodiments described here include, for example, methods of making compositions, compounds, devices, methods of making, and methods of using.

Some embodiments provide methods comprising providing at least one first thiophene monomer and at least one second thiophene monomer different from the first, and reacting the first and second thiophene monomers in the presence of a transition metal to form a copolymer, where the first thiophene monomer comprises a first functionality at the 2-position and 5-position, the second thiophene monomer comprises a second functionality at the 2-position and 5-position adapted to react with the first functionality, and both thiophene monomers comprise substituents comprising an oxygen bonded to each thiophene ring at the 3-position and the 4-position.

Other embodiments provide, for example, a method comprising: providing at least one first thiophene monomer, providing at least one second thiophene monomer, said second thiophene monomer being different from said first thiophene monomer, wherein said first thiophene monomer comprises a first functionality at the 2-position and the 5-position, wherein the first functionality is not bromine, wherein said second thiophene monomer comprises a second functionality at the 2-position and the 5-position, said second functionality being adapted to react with said first functionality, wherein said first thiophene monomer and said second thiophene monomer each comprise substituents at the 3-position and the 4-position, said substituents comprising an oxygen bonded to the thiophene ring; and reacting said at least one first thiophene monomer and said at least one second thiophene monomer in the presence of a transition metal to form a copolymer.

Other embodiments provide copolymers comprising at least one first thiophene repeat unit and at least one second thiophene repeat unit different from the first, where both thiophene repeat units comprise substituents comprising an oxygen bonded to each thiophene ring at the 3-position and the 4-position, and where both thiophene repeat units are connected at the 2-position and 5-position to neighboring repeat units or end groups.

Still other embodiments provide ink compositions, coated substrates, and devices comprising such copolymers. Devices may comprise OLEDs or OPVs. The OLEDs may comprise hole injection layers that comprise such copolymers. The OPVs may comprise hole transport layers that comprise such copolymers. The copolymers can be in doped or undoped form.

Yet other embodiments provide methods for selecting which thiophene monomers used in a copolymerization should be dihalogenated and which should be dimetallated (or disilylated), in order to decrease yield losses during monomer purification by distillation and/or control rapid polymerization rates. In some embodiments, the dihalogenated monomers comprise substituents comprising an oxygen bonded to each thiophene ring at the 3-position and the 4-position. In others, both the dihalogenated and dimetallated (or disilylated) monomers comprise such substituents.

These and yet other embodiments provide methods for making copolymers useful in such devices as OLEDs and OPVs, while reducing comonomer losses and decreasing the need for using highly reactive comonomers.

An advantage for at least one embodiment includes more flexibility in the formulation and building of an organic electronic device, such as, for example, an OLED or OPV device. In particular, films made from the compositions described herein, upon casting and annealing, can be intractable to toluene. In particular, the compositions described herein can be used when it is desirable to cast subsequent layers of emissive layers. Additionally, the intractability to toluene or other solvents can enable orthogonal compatibility necessary for all solution processed devices, and can be used to create solution processed devices.

DETAILED DESCRIPTION

Introduction

All references cited herein are incorporated by reference in their entirety.

Priority U.S. Provisional Ser. No. 61/287,977 filed Dec. 18, 2009 is hereby incorporated by reference in its entirety.

Copolymers and copolymer architecture are generally known in the art. See, for example, Billmeyer, *Textbook of Polymer Science,* 3rd Ed, 1984 (e.g., Chapter 5); *Concise Encyclopedia of Polymer Science and Engineering,* (Kroschwitz, Ed.), 1990 "Copolymerization" and "Alternating Copolymers." As an example, copolymers include block copolymers, segmented copolymers, graft, alternating copolymers, random copolymers, and the like. Copolymers include polymers with two or more different types of repeat groups, including terpolymers.

Conjugated polymers are also generally known in the art. Examples include polythiophenes (including regioregular polythiophene derivatives), polypyrroles, poly(phenylene vinylenes), polyanilines, and the like.

Organic electronic devices are known in the art.

Donors and acceptors are described in U.S. patent application Ser. No. 11/745,587 to Laird et al., filed May 2, 2007, and U.S. patent application Ser. No. 12/340,587 to Laird et al., filed Dec. 19, 2008, both of which are incorporated by reference in their entirety.

Additional description of methods may be found in, for example, McCullough et al., *J. Org. Chem.*, 1993, 58, 904-912, and U.S. Pat. No. 6,602,974, including formation of block copolymers, to McCullough, et al.

Additional description can be found in the articles, "The Chemistry of Conducting Polythiophenes," by Richard D. McCullough, *Adv. Mater.* 1998, 10, No. 2, 93-116, and references cited therein, and Lowe, et al., *Adv. Mater.* 1999, 11, 250, which are hereby incorporated by reference in its entirety. *The Handbook of Conducting Polymers*, 2nd Ed., 1998, Chapter 9, by McCullough, et al., "Regioregular, Head-to-Tail Coupled Poly(3-alkylthiophene) and its Derivatives," pages 225 258, is also hereby incorporated by reference in its entirety.

"Optionally substituted" groups refers to functional groups that may be substituted or unsubstituted by additional functional groups. When a group is unsubstituted by an additional group it may be referred to as a group name, for example alkyl or aryl. When a group is substituted with additional functional groups it may more generically be referred to as substituted alkyl or substituted aryl, respectively.

"Aryl" refers to, for example, an aromatic carbocyclic group of from 6 to 20 carbon atoms having a single ring (e.g., phenyl) or multiple condensed rings (e.g., naphthyl or anthryl) which condensed rings may or may not be aromatic provided that the point of attachment is at an aromatic carbon atom. Preferred aryls include, for example, phenyl, naphthyl, and the like.

"Alkyl" refers to, for example, straight chain and branched alkyl groups having from 1 to 20 carbon atoms, or from 1 to 15 carbon atoms, or from 1 to 10, or from 1 to 5, or from 1 to 3 carbon atoms. This term is exemplified by groups such as, for example, methyl, ethyl, n-propyl, iso-propyl, n-butyl, t-butyl, n-pentyl, ethylhexyl, dodecyl, isopentyl, and the like.

"Substituted" groups refer to, for example, a group having from 1 to 3, and preferably 1 to 2, substituents selected from the group consisting of alkyl, alkoxy, substituted alkoxy, acyl, acylamino, acyloxy, amino, substituted amino, aminoacyl, aryl, substituted aryl, aryloxy, substituted aryloxy, cyano, halogen, hydroxyl, nitro, carboxyl, carboxyl esters, cycloalkyl, substituted cycloalkyl, heteroaryl, substituted heteroaryl, heterocyclic, and substituted heterocyclic.

"Alkoxy" refers to, for example, the group "alkyl-O—" which includes, by way of example, methoxy, ethoxy, n-propyloxy, iso-propyloxy, n-butyloxy, t-butyloxy, n-pentyloxy, 1-ethylhex-1-yloxy, dodecyloxy, isopentyloxy, and the like. Another example of alkoxy is alkoxyalkoxy or alkoxyalkoxyalkoxy, and the like.

"Substituted alkoxy" refers to, for example, the group "substituted alkyl-O—" including, for example, fluorinated groups and perflourinated groups.

"Alkenyl" refers to, for example, alkenyl group preferably having from 2 to 6 carbon atoms and more preferably 2 to 4 carbon atoms and having at least 1 and preferably from 1-2 sites of alkenyl unsaturation. Such groups are exemplified by vinyl, allyl, but-3-en-1-yl, and the like.

"Substituted alkenyl" refers to, for example, alkenyl groups having from 1 to 3 substituents, and preferably 1 to 2 substituents, selected from the group consisting of alkoxy, substituted alkoxy, acyl, acylamino, acyloxy, amino, substituted amino, aminoacyl, aryl, substituted aryl, aryloxy, substituted aryloxy, cyano, halogen, hydroxyl, nitro, carboxyl, carboxyl esters, cycloalkyl, substituted cycloalkyl, heteroaryl, substituted heteroaryl, heterocyclic, and substituted heterocyclic with the proviso that any hydroxyl substitution is not attached to a vinyl (unsaturated) carbon atom.

"Aryloxy" refers to, for example, the group aryl-O— that includes, by way of example, phenoxy, naphthoxy, and the like.

"Alkynyl" refers to, for example, an alkynyl group preferably having from 2 to 6 carbon atoms and more preferably 2 to 3 carbon atoms and having at least 1 and preferably from 1-2 sites of alkynyl unsaturation.

"Substituted alkynyl" refers to, for example, an alkynyl group having from 1 to 3 substituents, and preferably 1 to 2 substituents, selected from the group consisting of alkoxy, substituted alkoxy, acyl, acylamino, acyloxy, amino, substituted amino, aminoacyl, aryl, substituted aryl, aryloxy, substituted aryloxy, cyano, halogen, hydroxyl, nitro, carboxyl, carboxyl esters, cycloalkyl, substituted cycloalkyl, heteroaryl, substituted heteroaryl, heterocyclic, and substituted heterocyclic.

"Aryloxy" can be for example the group aryl-O— that includes, by way of example, phenoxy, naphthoxy, and the like.

"Substituted aryloxy" can be, for example, substituted aryl-O— groups.

"Alkylene oxide" or "alkyleneoxy" or "polyether" can be, for example, the group —O($R_a$—O)$_n$—$R_b$ where $R_a$ is alkylene and $R_b$ is alkyl or optionally substituted aryl and n is, for example, an integer from 1 to 6, or from 1 to 3. Alkylene oxide can be, for example, based on such groups as ethylene oxides or propylene oxides. Alkylene oxide can, for example, include a variety of alkylene segments in the same chain, for example:

—OCH$_2$OCH$_2$CH$_2$CH$_2$CH$_2$OCH$_2$CH$_2$CH$_2$OCH$_2$CH$_2$OC$_6$H$_5$.

"Conjugated polymer" refers to, for example, polymers comprising at least some conjugated unsaturation in the backbone.

"A polythiophene" or "polythiophene" refers to, for example, polymers comprising a thiophene in the backbone including polythiophene, derivatives thereof, and copolymers and terpolymers thereof.

"Regioregular polythiophene" refers to, for example, polythiophene having high levels of regioregularity including for example at least 80%, or at least 90%, or at least 95%, or at least 98%, or at least 99%.

"Alkylene" can be, for example, groups represented by —[CH$_2$], such as, for example, ethylene or propylene, including both substituted and unsubstituted forms. Alkylene can be, for example, a C1-C6 group such as, for example, a C2, C3, C4, C5, or C6 group.

Fluorinated groups, moieties, or substituents can comprise at least one fluorine and can include perfluorinated groups, moieties, or substituents.

It is understood that in all substituted groups defined above, polymers arrived at by defining substituents with further substituents to themselves (e.g., substituted aryl having a substituted aryl group as a substituent which is itself substituted with a substituted aryl group, etc.) are not intended for inclusion herein. In such cases, the maximum number of such substituents is three. That is to say that each of the above definitions is constrained by a limitation that, for example, substituted aryl groups are limited to -substituted aryl-(substituted aryl)-substituted aryl.

Similarly, it is understood that the above definitions are not intended to include impermissible substitution patterns (e.g., methyl substituted with 5 fluoro groups or a hydroxyl group alpha to ethenylic or acetylenic unsaturation). Such impermissible substitution patterns are well known to the skilled artisan.

Copolymers, Comonomers, Repeat Units, End Groups

Methods are disclosed to produce copolymers. Copolymers are macromolecular chains comprising repeat units and end groups. There may be two, three, or even more different types of repeat units in a copolymer chain, each with a different composition. Differing repeat units may alternate to form alternating copolymers or they may be randomly distributed throughout the chain to form random copolymers. Alternating and random copolymers differ from block copolymers, which comprise long runs of similarly composed repeat units concatenated to adjoining runs comprising other repeat units. Copolymers may be used in such electronic devices as photovoltaic cells and light emitting diodes. See, for example, US Patent Publication 2008/0121281 published May 29, 2008. Copolymers may also be referred to as polymers.

Some copolymers are products of reacting comonomers with themselves. Others are products of reacting comonomers with copolymers. Still others are products of reacting copolymers with copolymers. Comonomers comprise a repeat unit and end groups. Comonomers may also be referred to as monomers.

Number average molecular weights of such copolymers are not particularly limiting, but may be between approximately 1,000 and 1,000,000 g/gmol and may be more typically between approximately 5,000 and 100,000 g/gmol. In many cases, molecular weight is suitable to allow for solubility.

Some copolymers may be conjugated. Conjugated polymers are known in the art including their use in organic electronic devices. See for example Friend, "Polymer LEDs," *Physics World*, November 1992, 5, 11, 42-46; see for example Kraft et al., "Electroluminescent Conjugated Polymers-Seeing Polymers in a New Light," *Angew. Chem. Int. Ed.* 1998, 37, 402-428. In addition, electrically conductive or conjugated polymers are described in *The Encyclopedia of Polymer Science and Engineering*, Wiley, 1990, pages 298-300, including polyacetylene, poly(p-phenylene), poly(p-phenylene sulfide), polypyrrole, and polythiophene, including families of these polymers and derivatives in these polymer systems, which is hereby incorporated by reference in its entirety. This reference also describes blending and copolymerization of polymers, including block copolymer formation.

Thiophene Repeat Units and Thiophene Monomers

Some copolymers and monomers may comprise repeat units that are derivatives of thiophene. Such monomers may be referred to as thiophene monomers. Synthetic methods, doping (e.g., chemical and/or electrochemical oxidation or reduction doping), and polymer characterization, including regioregular polythiophenes with side groups, is provided in, for example, U.S. Pat. No. 6,602,974 to McCullough et al. and U.S. Pat. No. 6,166,172 to McCullough et al., which are hereby incorporated by reference in their entirety. Additional description can be found in the article, "The Chemistry of Conducting Polythiophenes," by Richard D. McCullough, *Adv. Mater.* 1998, 10, No. 2, pages 93-116, and references cited therein, which is hereby incorporated by reference in its entirety. Another reference which one skilled in the art can use is the *Handbook of Conducting Polymers*, $2^{nd}$ Ed. 1998, Chapter 9, by McCullough et al., "Regioregular, Head-to-Tail Coupled Poly(3-alkylthiophene) and its Derivatives," pages 225-258, which is hereby incorporated by reference in its entirety. This reference also describes, in chapter 29, "Electroluminescence in Conjugated Polymers" at pages 823-846, which is hereby incorporated by reference in its entirety.

Substituents

Substituents which can be used to solubilize conducting polymers with side chains include alkoxy, polyether, and alkyl including for example C1 to C25 groups, as well as heteroatom systems which include for example oxygen and nitrogen. In particular, substituents having at least three carbon atoms, or at least five carbon atoms can be used. Mixed substituents can be used. The substituents can be nonpolar, polar or functional organic substituents. The side group can be called a substituent R which can be for example alkyl, perhaloalkyl, vinyl, acetylenic, alkoxy, aryloxy, vinyloxy, thioalkyl, thioaryl, ketyl, thioketyl, and optionally can be substituted with atoms other than hydrogen. Fluorinated and perfluorinated substituents can be used to provide fluorinated and perfluorinated monomers and copolymers.

Copolymers Comprising 3,4-Disubstituted Thiophenes

Of particular importance are copolymers comprising repeat units comprising 3,4-disubstituted thiophenes, with oxygen atoms at the 3- and 4-positions linking substituents to the thiophene ring, and with carbon-carbon linkages at the 2- and 5-positions to adjoining repeat units. Substituents can be used to solubilize the 3,4-substituted thiophene with side chains that can include alkoxy and polyether, including for example, straight or branched carbon chains, for example, C1 to C25 groups, wherein one, two, three, four, five, or six of the carbon atoms in the chains may be replaced by heteroatoms, such as oxygen and/or nitrogen and/or sulfur. The 3,4-disubstituted polythiophene may have a symmetrical monomer repeating unit. Note that that the substituents at the 3- and 4-positions of the ring may be connected to each other via covalent bonds, as would be the case in the example of a 3,4-ethylenedioxy substitution. Examples of substituents are provided in, for example, U.S. patent application Ser. No. 12/422,159, filed Apr. 10, 2009 to Brown et al. (PCT/US09/040257), and US Provisional Application Ser. No. 61/119,239, filed Dec. 2, 2008 to Brown et al., both of which are incorporated herein by reference in their entirety.

An example of such a copolymer is the alternating copolymer represented by:

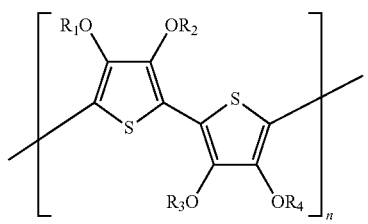

where n represents the number of times the bracketed moiety is repeated in the chain; independently $R_1$ comprises alkyl, optionally substituted alkyl, alkenyl, optionally substituted alkenyl, alkynyl, optionally substituted alkynyl, aryl, optionally substituted aryl; independently $R_2$ comprises alkyl, optionally substituted alkyl, alkenyl, optionally substituted alkenyl, alkynyl, optionally substituted alkynyl, aryl, optionally substituted aryl; independently $R_3$ comprises alkyl, optionally substituted alkyl, alkenyl, optionally substituted alkenyl, alkynyl, optionally substituted alkynyl, aryl, optionally substituted aryl; and independently $R_4$ comprises alkyl, optionally substituted alkyl, alkenyl, optionally substituted alkenyl, alkynyl, optionally substituted alkynyl, aryl, optionally substituted aryl. $R_1$ and $R_2$ may be connected by covalent bonds. $R_3$ and $R_4$ may be connected by covalent bonds.

Another example of such a copolymer is the alternating copolymer represented by:

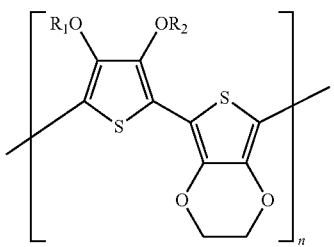

where n represents the number of times the bracketed moiety is repeated in the chain; independently $R_1$ comprises alkyl, optionally substituted alkyl, alkenyl, optionally substituted alkenyl, alkynyl, optionally substituted alkynyl, aryl, optionally substituted aryl; and independently $R_2$ comprises alkyl, optionally substituted alkyl, alkenyl, optionally substituted alkenyl, alkynyl, optionally substituted alkynyl, aryl, optionally substituted aryl. $R_1$ and $R_2$ may be connected by covalent bonds.

Yet another example of such a copolymer is the random copolymer represented by:

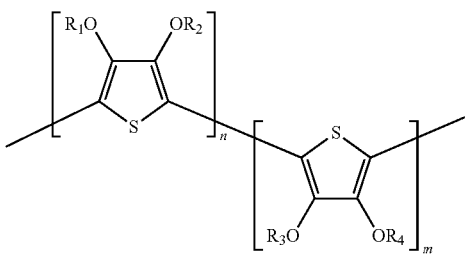

where n represents the number of times the first bracketed moiety appears in the chain and m represents the number of times the second bracketed moiety appears in the chain; independently $R_1$ comprises alkyl, optionally substituted alkyl, alkenyl, optionally substituted alkenyl, alkynyl, optionally substituted alkynyl, aryl, optionally substituted aryl; independently $R_2$ comprises alkyl, optionally substituted alkyl, alkenyl, optionally substituted alkenyl, alkynyl, optionally substituted alkynyl, aryl, optionally substituted aryl; independently $R_3$ comprises alkyl, optionally substituted alkyl, alkenyl, optionally substituted alkenyl, alkynyl, optionally substituted alkynyl, aryl, optionally substituted aryl; and independently $R_4$ comprises alkyl, optionally substituted alkyl, alkenyl, optionally substituted alkenyl, alkynyl, optionally substituted alkynyl, aryl, optionally substituted aryl. $R_1$ and $R_2$ may be connected by covalent bonds. $R_3$ and $R_4$ may be connected by covalent bonds.

Still another example of such a copolymer is the random copolymer represented by:

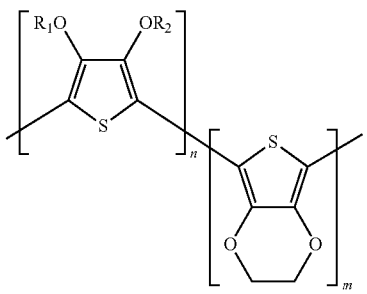

where n represents the number of times the first bracketed moiety appears in the chain and m represents the number of times the second bracketed moiety appears in the chain; independently $R_1$ comprises alkyl, optionally substituted alkyl, alkenyl, optionally substituted alkenyl, alkynyl, optionally substituted alkynyl, aryl, optionally substituted aryl; and independently $R_2$ comprises alkyl, optionally substituted alkyl, alkenyl, optionally substituted alkenyl, alkynyl, optionally substituted alkynyl, aryl, optionally substituted aryl. $R_1$ and $R_2$ may be connected by covalent bonds.

In some embodiments, copolymers comprise at least one first thiophene monomer and at least one second thiophene monomer, each with oxygen atoms at the 3- and 4-positions linking substituents to the thiophene ring, where the substituents on the first thiophene monomer comprise chains of at least five carbons or heteroatoms and where the substituents on the second thiophene monomer comprise chains of fewer than five carbons or heteroatoms.

Organometallic Coupling Reactions and Catalysts

Some embodiments provide reaction via organometallic mediated coupling reactions, sometimes referred to as Ullmann reactions. Such coupling reactions create carbon-carbon bonds between repeat units, through the reaction of halogenated end groups and metallated end groups in the presence of a polymerization catalyst:

$$R_1X+R_2M \rightarrow R_1-R_2+MX$$

where $R_1$ and $R_2$ represent either monomers or ends of growing chains. Such reactions are described in the following references, each of which is incorporated by reference in its entirety: *Cross-Coupling Reactions: A Practical Guide*, Ed. Miyaura, 2002; *Handbook of Organopalladium Chemistry/br Organic Synthesis*, Ed. Negishi, 2002; Kuwano, R, Utsunomiya, M., Hartwig, J. F., *J. Org. Chem.,* 2002, 67, 6479-6486; Yu et al., *J. Am. Chem. Soc.,* 2009, 131, 56; Yang et al., *Macromol.* 2008, 41, 6012; LeClerc et al., *J. Am. Chem. Soc.,* 2008, 130, 732; Swager et al., *Adv. Mater.,* 2001, 13, 1775; Koeckelberghs et al., *Macromol.,* 2007, 40, 4173; Hassan, J. et al., *Chem. Rev.* 2002, 102, 1359.

"Halogenated end groups" comprise functional groups bearing one or more halogens. Halogenated end groups include —F, —Cl, —Br, "Metallated (or silylated) end groups" comprise functional groups that engage in organometallic mediated coupling reactions with halogenated end groups in the presence of a polymerization catalyst. Examples of metallated (or silylated) end groups include —MgX, —ZnX, —MnX, MgX:

LiX, —B(OR)$_2$, —SnR$_3$, —SiR$_3$, where X is a halogen, Y is a halogen, and R is an alkyl group.

"Polymerization catalysts" comprise metal-bearing compounds that increase the rate of coupling between halogenated end groups and metallated (or silylated) end groups. They may also help control the stereroregularity of the copolymer. These compounds are typically organometallic compounds and may comprise transition metals. Palladium and nickel are common metals used in such polymerization catalysts.

There are several named organometallic coupling reactions, depending upon the metallated or silylated end group employed. Examples are:

| Reaction Name | Met./Sil. End group | Exemplary Catalysts |
|---|---|---|
| Kumada | —MgX, —MnX, —MgX:LiY | Ni(dppp)Cl$_2$ or Ni(dppe)Cl$_2$ or Pd(PPh$_3$)$_4$ |
| Negishi | —ZnX | Ni(PPh$_3$)$_4$ or Pd(PPh$_3$)$_4$Cl$_2$ + 2 Al(i-Bu)$_2$H Ni(cod)$_2$ + dppe |
| Suzuki | —B(OR)$_2$ | Pd(PPh$_3$)$_4$ or Pd(OAc)$_2$ or NiCl$_2$ |
| Stille | —SnR$_3$ | PdCl$_2$, Pd(OAc)$_2$, Pd(OX), + (o-tolyl)$_3$P |
| Hiyama | —SiR$_3$ | PdBr$_2$ or Pd(OAc)$_2$ or NiBr$_2$ |

For additional technology, see PCT/US07/077461 and universal Grignard metathesis polymerization (Carnegie Mellon University), including, for example, for Kumada reaction and use of —LiX.

Additional activators or promoters may be used in these systems, as is known to those skilled in the art. For example, Negishi and Stille coupling may use lithium compounds; Suzuki coupling may use bases; Hiyama coupling may use bases or fluorides; and so on. Another example is inverted Suzuki, wherein the cross-coupling reaction is done with a dihalogenated electron rich species with an electron deficient dimetallated species.

As depicted in the examples of Schemes 1A, 1B, 2A, and 2B, both alternating and random copolymers may be produced using organometallic mediated coupling reactions. In FIGS. 1A and 1C, some of the comonomers are provided in both dihalogenated and dimetallated (or disilylated) form, enabling randomization of the stereochemistry.

In addition, mixtures of A-B monomers can be prepared and polymerized or copolymerized to form random copolymers.

The first functionality on 2-position and on the 5-position for the first thiophene monomer can be the same or different.

The first functionality on the 2-position and on the 5-position can be not halogen, or not bromine.

Scheme 1A (Example of random copolymerization)

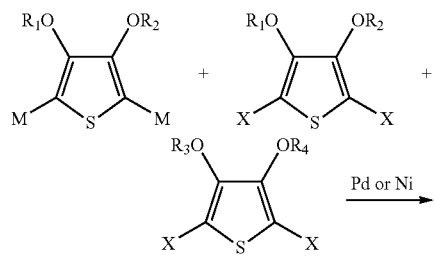

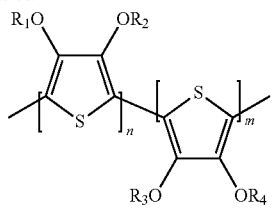

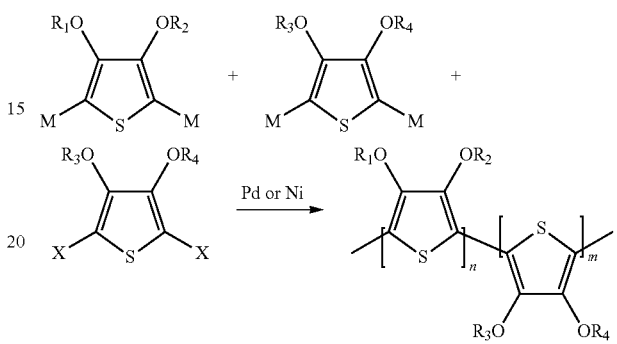

Scheme 1B (Example of alternating copolymerization)

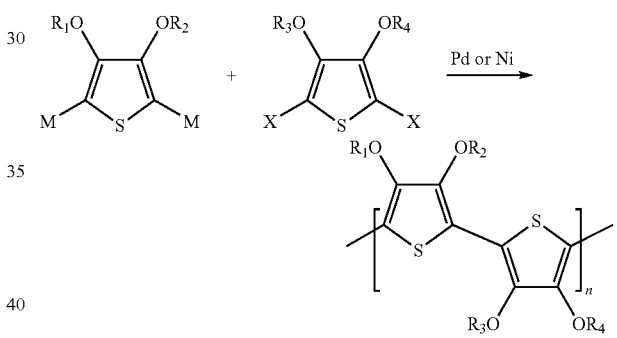

Scheme 2A (example of random copolymerization, where one of the comonomers comprises ethylene diethoxythiophene)

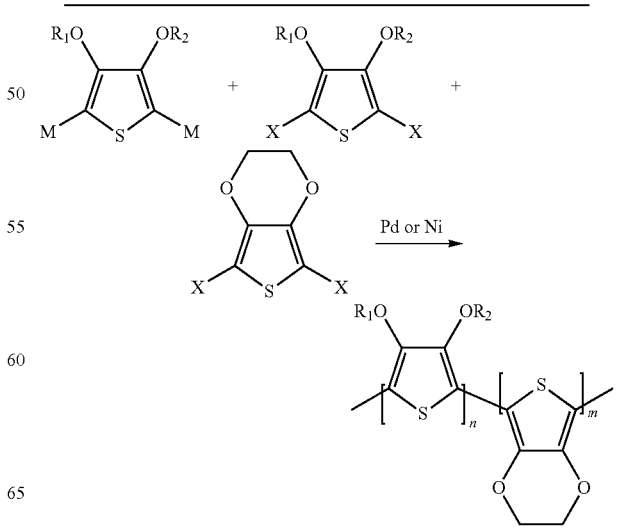

-continued

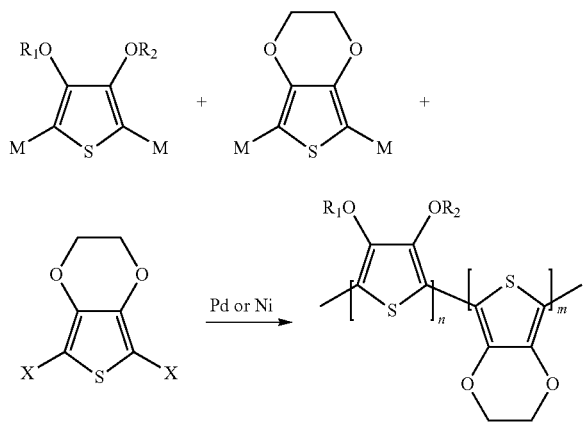

Scheme 2B (an example of alternating copolymerization, where one of the comonomers comprises ethylene diethoxythiophene)

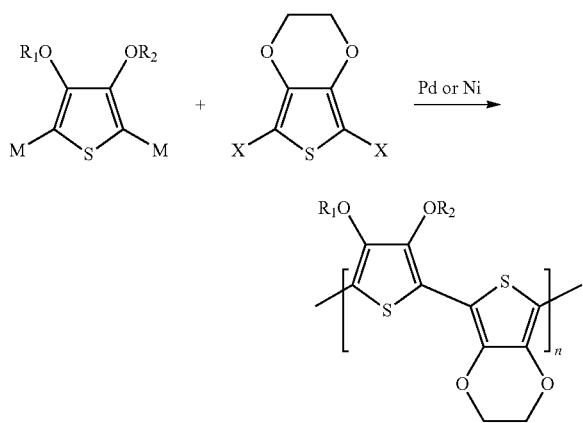

Dihalogenated and Dimetallated/Disilylated Monomers

Some embodiments provide copolymers formed by the reaction of monomers. Of particular interest are dihalogenated monomers and dimetallated (or disilylated) monomers. "Dihalogenated monomers" are monomers each bearing two halogenated end groups. "Dimetallated (or disilylated) monomers" are monomers each bearing two dimetallated or disilylated end groups.

Dihalogenated monomers and dimetallated (or disylated) monomers can participate in organometallic coupling reactions to form copolymers. Examples of such copolymers are alternating copolymers or random copolymers.

One example of such a system is disclosed in U.S. Pat. No. 4,508,639 to Camps et al., which is incorporated by reference in its entirety. Camps describes copolymerization of dibrominated monomers with —MgBr-bearing dimetallated monomers in the presence of dichloro(1,3-bidiphenylphosphino)propane-nickel catalysts.

Some dihalogenated (or disilylated) monomers comprising 3,4-disubstituted thiophenes may be represented by:

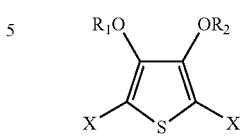

where X is a halogen, and $R_1$ and $R_2$ may be such substituents as alkyl, optionally substituted alkyl, alkenyl, optionally substituted alkenyl, alkynyl, optionally substituted alkynyl, aryl, or optionally substituted aryl groups. Specific examples include 2,5-dibromo-3,4-bis(2-(2-butoxyethoxy)ethoxy) thiophene, or 2,5-dibromo-3,4-bis(2-(2-ethoxyethoxy) ethoxy)thiophene; 2,5-dibromo-3,4-bis(2-(2-methoxyethoxy)ethoxy)thiophene; 2,5-dibromo-3,4-bis(2-(2-butoxyethoxy)ethoxy)thiophene; 2,5-dibromo-3,4-bis(2-(2-butoxybutoxy)butoxy)thiophene; and 2,5-dibromo-3,4-bis (2-(2-methoxymethoxy)methoxy)thiophene. Note that that the substituents at the 3- and 4-positions of the ring may be connected to each other via covalent bonds, as would be the case for 2,5-dihalo-(3,4-ethylenedioxy)thiophene, represented as:

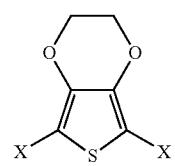

where X is a halogen.

Some dimetallated (or disilylated) monomers comprising 3,4-disubstituted thiophenes can be represented as:

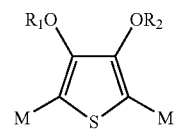

where M is selected from the group: MgX, MnX, ZnX, MgX:LiY, B(OR)$_2$, SnR$_3$, SiR$_3$, X is a halogen, Y is a halogen, R is an alkyl group, and $R_1$ and $R_2$ may be such substituents as alkyl, optionally substituted alkyl, alkenyl, optionally substituted alkenyl, alkynyl, optionally substituted alkynyl, aryl, or optionally substituted aryl groups. Specific examples include 2,5-bis(magnesiobromo)-3,4-bis(2-(2-butoxyethoxy)ethoxy)thiophene, or 2,5-bis(magnesiobromo)-3,4-bis(2-(2-ethoxyethoxy)ethoxy)thiophene; 2,5-bis(magnesiobromo)-3,4-bis(2-(2-methoxyethoxy)ethoxy)thiophene; 2,5-bis(magnesiobromo)-3,4-bis(2-(2-butoxyethoxy)ethoxy) thiophene; 2,5-bis(magnesiobromo)-3,4-bis(2-(2-butoxybutoxy)butoxy)thiophene; and 2,5-bis (magnesiobromo)-3,4-bis(2-(2-methoxymethoxy)methoxy) thiophene. Note that that the substituents at the 3- and 4-positions of the ring may be connected to each other, as would be the case for 2,5-bis(magnesiobromo)-(3,4-ethylenedioxy)thiophene.

Decreasing Losses During Monomer Purification By Distillation

Monomers generally need to be purified before polymerization. At larger scales of production, economics may require that this purification be carried out by distillation. When such distillation is carried out batchwise, purified monomers may be taken from distillate cuts based on boiling point ranges. Likewise, when such distillation is carried out continuously, monomers may be taken from distillate condensed from the overhead vapor of the column or from one or more side-draws along the length of the column. Distillation technology is described in such standard references as Chapter 13 of *Chemical Engineers' Handbook*, 5th ed., 1973, Perry, R. H. and Chilton, C. H., eds., McGraw-Hill, New York, which is incorporated by reference in its entirety.

Some dihalogenated monomers may be lost to degradation or side reactions that may occur during purification by distillation. Dihalogenated monomers are representative as losses could also occur with metalated monomers, including stannylated monomers. The extent of yield losses may vary according to the identity of the dihalogenated monomer and its temperature history. Although it may be possible to limit losses by using lower temperature distillation processes, such as vacuum distillation and steam distillation, or by using other purification techniques, such alternatives may become cost-prohibitive at larger scales.

In some cases, yield losses may be decreased by ensuring that monomers that cannot be economically purified by distillation when provided in the dihalogenated form instead be provided in the dimetallated (or disilylated) form. Dihalogenated monomers may be rank-ordered according to their relative stability during distillation, using the best known conditions for each. The more unstable monomers may be selected to be provided in dimetallated (or disilylated) form, while the more stable monomers may be provided in dihalogenated form.

Decreasing Reactivity During Polymerization

Some dihalogenated monomers, when used in organometallic coupling reactions, react too readily for commercial use. At larger scales of production, heat removal and/or goodness of mixing may become inadequate because of rapid polymerization. In some cases, expensive capital investments may be required to correct these problems. In other cases, polymer production may be limited by the decreased monomer feed rates that may be required to control the rate of polymerization.

In some cases, high reaction rates may by decreased by ensuring that monomers that are highly reactive when provided in the dihalogenated form instead be provided in the dimetallated (or disilylated) form. Dihalogenated monomers may be rank-ordered according to their relative reactivity during polymerization, using the best known conditions for each. The more reactive monomers may be selected to be provided in dimetallated (or disilylated) form, while the less reactive monomers may be provided in dihalogenated form.

Inks Comprising Copolymers

In some embodiments, inks comprising copolymers can be formulated and blended by methods known in the art to formulators including, for example, varying the amounts of the components, varying combinations of different structural types, use of different mixing conditions, using different solvents, applying different film preparation conditions, using different purification methods, and the like.

Inks may comprise blends. A blend can be compatible when it is not characterized by excessive phase separation and forms functionally useful, mechanically stable films which can function as a hole injection layer (HIL). Compatible blends are known in the art. Sec, for example, U.S. Pat. Nos. 4,387,187; 4,415,706; 4,485,031; 4,898,912; 4,929,388; 4,935,164; and 4,990,557. Compatible blends do not have to be miscible blends, but are sufficiently mixed and stable to provide useful function, particularly in thin film form such as, for example, about 2 nm to about 100 nm. Blending methods may include solution blending of a predissolved conducting polymer either in neutral or oxidized form disintegrated into nanosized particles (typically from tens to hundreds of nanometers) with conventional polymers (e.g., polystyrene (PS), poly(methyl methacrylate) (PMMA), poly(vinyl acetate) (PVA)) by sonicating, agitation, or shear. Such blends provide fine dispersion of film-forming sub-micronic particles of stable polymer matrix solutions. Films can be prepared and analyzed for compatibility by spin coating.

In some embodiments, a matrix component can be used which helps provide the needed properties, such as planarization, for the hole injection or hole transport layers (HILs and HTLs, respectively). The matrix component, including planarizing agents, when blended with the hole injection component, will facilitate the formation of HILs or HTLs in a device such as an OLED or OPV device. It will also be soluble in the solvent that is used to apply the HIL system. The planarizing agent may be comprised of, for example, a polymer or oligomer, such as an organic polymer, such as poly (styrene) or poly(styrene) derivatives, poly(vinyl acetate) or its derivatives, poly(ethylene glycol) or its derivatives, poly (ethylene-co-vinyl acetate), poly(pyrrolidone) or its derivatives (e.g., poly(1-vinylpyrrolidone-co-vinyl acetate)), poly (vinyl pyridine) or its derivatives, poly(methyl methacrylate) or its derivatives, poly(butyl acrylate) or its derivatives. Other examples include polyphenols, polycarbonates, and/or their fluorinated derivatives. More generally, it can be comprised of polymers or oligomers built from monomers such as $CH_2CH—Ar$, where Ar is any aryl or functionalized aryl group, isocyanates, ethylene oxides, conjugated dienes, $CH_2CHR_1R$ (where $R_1$ is alkyl, aryl, or alkyl/aryl functionalities and R is H, alkyl, Cl, Br, F, OH, ester, acid, or ether), lactam, lactone, siloxanes, and Atom Transfer Radical Polymerization (ATRP) macroinitiators. In general, several different polymers may be used in the formulation.

A planarizing agent can also be a "non-fugitive" small molecule that is soluble in the application solvent, but does not evaporate upon removal of the solvent. It may possess alkyl, aryl, or functional alkyl or aryl character. Additionally, the small molecules may comprise of cross-linking functionalities such as for example, vinyl, trifluorovinyloxy, cinnamate, acrylate etc. These functionalities can be self-activated under thermo- or photo-excitation processes to undergo cross-linking and form a cross-linked, branched and/or networked structures. Alternatively, they can be activated by the presence of small quantities of a photosensitizers or radical initiators. (see Odian, G. "*Principles of polymerization*", $4^{th}$ edn., 2004, John Wiley & Sons Inc.). In addition to facilitating the providing of a smooth surface to the HIL layer, the matrix component or planarization agent can also provide other useful functions, such as resistivity control and transparency control. Planarity can be determined by methods known in the art including AFM measurements.

The solvent system, or solvents for dispersing polymers, can be a mixture of water and organic solvent, including water miscible solvents, and solvents that comprise oxygen, carbon, and hydrogen, such as, for example, an alcohol or an etheric alcohol. Additional examples of water miscible solvents include alcohols, such as isopropanol, ethanol, and methanol, and ethylene glycols and propylene glycols from Dow Chemical and Eastman Chemical. See, for example, Cellosolve, Carbitol, propanediol, methyl carbitol, butyl cellosolve, Dowanol PM. In some embodiments, the amount of water can be greater than the amount of organic solvent. A wide variety of combination of solvents can be used, such as non-aqueous solvents with alcohols and/or other polar solvents. The composition can comprise a first solvent and a second solvent, different than the first solvent. Other examples of solvent systems are provided in U.S. application Ser. No. 12/422,159, filed Apr. 10, 2009, which is incorporated by reference in its entirety.

Water soluble resins and aqueous dispersions can be used. Aqueous dispersions can be, for example, poly(styrene sulfonic acid) (e.g., PSS dispersion), Nafion dispersion (e.g., sulfonated fluorinated polymers), latex, and polyurethane dispersions. Examples of water soluble polymers include polyvinylpyrollidinone and polyvinyl alcohol. Other examples of resins include cellulose acetate resins (CA, CAB, CAP—Eastman).

Formulation can be carried out to modify surface energy, conductivity, film formation, solubility, crosslinking, morphology, film quality, specific application (e.g., spin coat, ink jet printing, screen printing, and the like).

Surfactants can be used including, for example, ionic and non-ionic surfactants, as well as polymer surfactants, fluorinated surfactants, and ionomers.

Resins and HIL inks can be dispersed and/or dissolved by any method known in the art including, for example, sonication.

If desired, the formulation can be formulated to include crosslinking agents which provide crosslinked structures which may swell but not dissolve upon solvent treatment and/or exposure.

Coated Substrates

Inks may be cast and annealed as a film on a substrate optionally containing an electrode or additional layers used to improve electronic properties of the final device. The films may be intractable to an organic solvent, which can be the solvent in the ink for subsequently coated or deposited layers during the fabrication of the device. The films may be intractable to toluene, which can be the solvent in the ink for subsequently coated or deposited layers during fabrication of the device.

Some embodiments will comprise a coated substrate comprising: a solid surface, a coating disposed on the surface, wherein the coating comprises one or more copolymers. Substrates can be those used in printed electronics. Substrates can be, for example, plastic, glass, metals, including silver and gold, and metal oxides (e.g., ITO, $TiO_2$, ZnO). The surface can be the surface of a homogeneous, heterogeneous, or multilayer substrate. Surfaces useful in OLED and OPV applications can be used. For example, the solid surface can be, for example, an electrode including a transparent electrode such as indium tin oxide. The surface can be a light emitting polymer layer or a hole transport layer. The thickness of the coating can be, for example, 5 nm to 5 microns, 10 nm to 1 micron, 25 nm to 500 nm, or 50 nm to 250 nm. Residual solvent may be present. The coating may be cross-linked or patterned.

Any coating or patterning method known in the art can be used. Microscale or nanoscale patterning can be carried out to form nanostructure or microstructures on the surface. Printing processes can include, for example, flexography, letter press, soft lithography, gravure, pad, offset lithography, screen, and inkjet printing.

Applications

The copolymers described herein can be used in organic electronic devices including, for example, OLEDs, OPVs including an OPV active layer, transistors, OFETs, batteries, and other printed electronics, as well as sensors. They may be included in hole injection layers or hole transport layers.

Printed electronics, and devices, materials, and methods used therein, arc generally known in the art. See, for example, *Printed Organic and Molecular Electronics*, Ed. D. Gamota et al., 2004. For example, Chapters 1 and 2 describe organic semiconductors, Chapter 3 describes manufacturing platforms for printing circuits, Chapter 4 describes electrical behavior of transistors and circuits, Chapter 5 describes applications, and Chapter 6 describes molecular electronics. See also Pope et al., *Electronic Processes in Organic Crystals and Polymers*, 1999.

OLED devices are known in the art. See, for example, US Patent Publication 2006/000787661, published Apr. 13, 2006. The devices can comprise, for example, multilayer structures including, for example, an anode, including a transparent conductor such as indium/tin oxide (ITO) on glass or PET or PEN; a hole injection layer; an electroluminescent layer, such as a polymer layer; a conditioning layer, such as LiF; and a cathode layer, such as Ca, Al, or Ba.

Photovoltaic cells are known in the art. See, for example, Sun and Sariciftci, *Organic Photovoltaics, Mechanisms, Materials, and Devices*, 2005. See, also, for example, US Patent Publication 2008/0315751 published Dec. 25, 2008 to Sheina et al. The photovoltaic cell can comprise an active layer comprising a composition comprising at least one p-type material and at least one n-type material. One can engineer HOMO, LUMO, and band gap for the p- and n-type materials for good performance. The morphology of the active layer can be adapted to provide good performance. For example, a nanoscale morphology can be prepared. An example is a bulk heterojunction.

In an OPV active layer, the polymers described herein, which can be p-type materials, can be combined with n-type materials or acceptor moieties, such as, for example, fullerenes and fullerene derivatives. An example of a fullerene derivative is PCBM. Fullerenes can be also derivatized with a moiety such as indene or substituted indene. One fullerene core can be derivatized with, for example, one, two, or three indene groups. Other types of n-type materials known in the art can be used. If desired, larger area photovoltaics can be fabricated. See, for example, Bundgaard et al., *Solar Energy Materials and Solar Cells*, 2007, 91, 1019-1025.

In these and other applications, for example, melting point of the polymer may be increase due to rigidification using smaller thiophene systems. This can be important in, for example, demonstrating morphological stability of films as a function of use temperature (both during device fabrication and device end use). Intractability of films to even aggressive solvents such as halogenated aromatics also, for example, may be improved owing to lowering of solubility of the doped polymer. Another potential benefit for at least some embodiments is possibly reduce any tailing or unwanted absorptions in the visible region and, hence, enhance the color neutrality of the final film.

Additional Embodiments

These and other features and advantages may be better understood from the following non-limiting additional embodiments.

Guidance for polymer synthesis and purification can be found in, for example, PCT/US09/040257 (Plextronics).

Comparative Embodiment 1. Poly(3,4-bis(2-(2-butoxyethoxy)ethoxy)thiophene-co-3,4-ethylenedioxythiophene)

Oxidative copolymerization of 1 (Working Example 1 below) and EDOT is accomplished using 2.5 eq of iron(IU) chloride or iron(III)tosylate in an organic solvent such as, for example, chloroform, chlorobenzene or nitrobenzene. After polymerization, the polymer is precipitated into methanol and further continuously extracted with methanol via Soxhlet to remove byproducts, unreacted monomers, oligomers, and/or metal impurities.

In the comparative embodiment 1, the polymerization is carried out via oxidative polymerization. This methods is uncontrolled and ratio of the monomers in the final subjective and may not depend on the monomer feed ratio. Also, attaining higher molecular weights is difficult as the reactivity of the oligomers decreases. The radical cation of the oxidized form is highly delocalized and the probability of it being on the chain end to undergo coupling is reduced.

Comparative Embodiment 2: Poly(3,4-bis(2-(2-butoxyethoxy)ethoxy)thiophene-co-3,4-ethylenedioxythiophene)

Bislithiation of the two monomers, 3,4-bis(2-(2-butoxyethoxy)ethoxy)thiophene and 3,4-ethylenedioxythiophene, is carried out in THF at −78° C. using n-butyl lithium. To this solution 2 eq (based on the thiophene monomer) anhydrous copper(II)chloride is added and the reaction mixture is allowed to warm up to room temperature. The polymerization ensues upon addition of the copper catalyst and upon completion the polymer is recovered via precipitation into methanol. Further extraction of the solids via methanol Soxhlet gives the metal free polymer.

However, limitations of the comparative embodiment 2 is that it uses excess amounts of metal, and removal of all the metal in some embodiments can be difficult and in some embodiments can be impossible.

Embodiment 3. Poly(3,4-bis(2-(2-butoxyethoxy)ethoxy)thiophene-co-3,4-ethylenedioxythiophene)

Bislithiation of 3,4-bis(2-(2-butoxyethoxy)ethoxy)thiophene is carried out in THF at −78° C. using 2 eq., n-Butyl lithium followed by transmetallation with ZnCl2 to obtain the bis(chlorozine) derivative of the starting material. Following this 1 eq of the 2,5-dibromo-3,4-ethylenedioxythiophene (Example 2) and 5-10 mol % of catalyst is added to initiate the polymerization. The catalyst can be chosen from the list given below.
  Bis(diphenylphosphino)ethane nickel(II)chloride
  1 eq Ni(cod)$_2$+1 eq of triphenylphsophine or bis(diphenylphosphino)ethane
  Bis(diphenylphosphino)ethane palladium(II)chloride
  Tetrakis(triphenylphosphine) palladium(0)
  1 eq Bis(dibenzylideneacetone) palladium (0)+3 eq tri-tert-butyl phosphine Since this is an AA BB type polymerization, the molecular weight will depend on the reaction times (longer the reaction time, higher the molecular weight). The molecular weight can also be controlled via monomer stoichiometry control.

Embodiment 4. Poly(3,4-bis(2-(2-butoxyethoxy)ethoxy)thiophene-alt-3,4-ethylenedioxy thiophene)

Bislithiation of 3,4-bis(2-(2-butoxyethoxy)ethoxy)thiophene is carried out in THF at −78° C. using 2 eq., n-Butyl lithium followed by quenching with trimethylstannylchloride. The bisstannyl derivative is then isolated by known aqueous work-up procedures (e.g., WO 2008/088595). Polymerization of the bistannyl derivative is carried out in degassed THF with 2,5-dibromo-3,4-ethylenedioxythiophene using Palladium catalysts described in previous example. The molecular weight of the polymer is controlled via the stoichiometry of the monomer feed ratios or by having a monofunctional monomer addition. The polymer is end-capped by the addition of a monofunctional derivative (e.g., 2-trimethylstannyl thiophene). The polymer is isolated by known methods.

The above reaction can also be done via a Suzuki protocol. After lithiation the thiophene is quenched using with isopropyl pinacol borate to form the pinacol boronic ester of thiophene. After isolation of the bisboranate ester the polymerization is carried out in THF with 2,5-dibromo-3,4-dialkoxythiophene or 2,5-dibromo-3,4-dimethoxythiophene to yield using Pd catalysts (example, Pd(PPhi) Pd$_2$(dba)$_3$, Pd(OAc)$_2$) and a base, such as potassium carbonate, potassium acetate, potassium phosphate or cesium carbonate, and the like.

Upon completion of polymerization the, polymer is end-capped using appropriate monofunctional end-capping reagent. Example, if Stille coupling 2-trimethylstannylthiophene is used and if Suzuki method is utilized end-capping is carried out in the presence of 2-thienyl pinacol boranate ester.

Comparative Embodiment 5. Poly(3,4-bis(2-(2-butoxyethoxy)ethoxy)thiophene-alt-3,4-ethylenedioxythiophene)

The alternating copolymers can also be prepared by first synthesizing the asymmetric dimer comprising each of the dialkoxythiophene as shown below. Following this the dibromo derivative of the dimer is prepared using N-bromosuccinimide. Subsequently, polymerization can be carried out via known literature procedures, such as GRIM and/or Universal GRIM as described in, for example, U.S. Pat. No. 6,166,172, Loewe et al., *Adv. Mater.* 1999, 11, 250-253, and Iovu, M. et al. *Macromolecules* 2009, 42, 30.

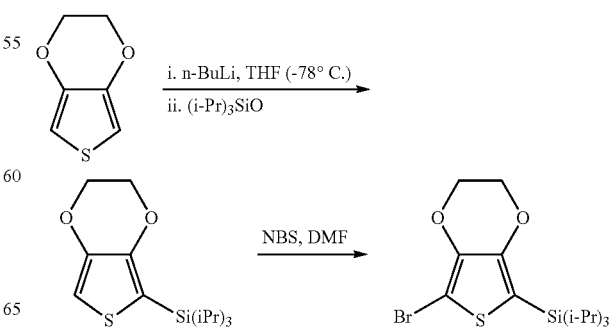

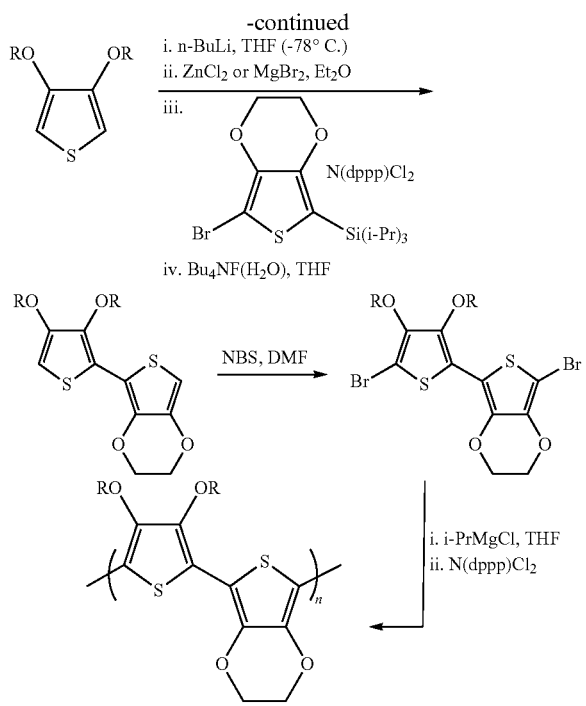

Mono lithiation of 3,4-ethylenedioxythiophene (EDOT) using n-butyl lithium in THF followed by quenching with tri-isopropylchloride gives the monosilylated EDOT as a crystalline solid. Bromination of this compound is carried out using N-bromosuccinimide (NBS) in DMF and the final compound is obtained as a white crystalline solid which is very stable at ambient conditions. Note: without the tri-isopropylsilyl protecting group the monobromo EDOT can be very unstable and difficult to isolate in its pure form. Monomagnesiobromo of 3,4-bis(2-(2-butoxyethoxy)ethoxy)thiophene is in situ generated by lithiation followed by addition of magnesiumbromide and reacted with the monobromoEDOT derivative using Ni(dppp)Cl$_2$ as catalyst. The compound is isolated via a column purification method and subjected to a de-silylation procedure using tert-butylammonium fluoride to obtain the asymmetric dimer. The dimer is then dibrominated using NBS in DMF followed by polymerization using GRIM method to obtain the copolymer wherein the repeat units are in a 1:1 ratio.

Some drawbacks of this synthesis are that it is tedious synthetically because of multiple protection and de-protection steps. Also, the GRIM protocol adopted may not yield a perfectly regioselective polymer due to similar steric nature of the substituents. Furthermore, the thermal stability of the dibromo derivative of the dimer is expected to drop due to the lowered oxidation potential of the dimer itself.

Embodiment 6. Poly3,4-bis(2-(2-butoxyethoxy)ethoxy)thiophene-ran-3,4-ethylenedioxythiophene)

Bislithiation of 3,4-bis(2-(2-butoxyethoxy)ethoxy)thiophene and 3,4-ethylenedioxythiophene is carried out in THF at −78° C. using 2 eq., n-butyl lithium followed by quenching with trimethylstannylchloride. The lithiation can carried out separately or in one pot and the mixture of bis-stannyl derivative (if one pot reaction) is then isolated by known aqueous work-up procedures (e.g., WO 2008/088595). Polymerization of the bistannyl derivative is carried out in de-gassed THF with 2,5-dibromo-3,4-ethylenedioxythiophene (keeping the Br:SnMe$_3$ to be 1:1) using Palladium catalysts described in previous example. The molecular weight of the polymer is controlled via the stoichiometry of the monomer feed ratios or by having a monofunctional monomer addition. The polymer is end-capped by the addition of a monofunctional derivative (e.g., 2-trimethylstannyl thiophene). The polymer is worked by using procedures reported earlier (e.g., PCT/US09/040257).

The above reaction can also be done via a Suzuki protocol. After lithiation, the thiophene is quenched with isopropyl pinacol borate to form the pinacol boronic ester of thiophene. After isolation of the bisboranate ester, the polymerization is carried out in THF with 2,5-dibromo-3,4-dialkoxythiophene or 2,5-dibromo-3,4-dimethoxythiophene to yield using Pd catalysts (example, Pd(PPh$_3$)Pd$_2$(dba)$_3$, Pd(OAc)$_2$) and a base such as potassium carbonate, potassium acetate, potassium phosphate or cesium carbonate, or the like.

Upon completion of polymerization, the polymer is end-capped using appropriate monofunctional end-capping reagent. An example, if Stille coupling used, is 2-trimethylstannylthiophene, and if Suzuki method is utilized, end-capping is carried out in the presence of 2-thienyl pinacol boranate ester.

Other examples of polymerization techniques and/or polymer end-capping are illustrated in the following references: (1) Smeets et al., *Macromolecules*, 2009, 42, 7638; (2) Khanduyeva, N. et al. *J. Am. Chem. Soc.*, 2009, 131, 153; (3) Kaul, E. et al., *Macromolecules*, 2009, ASAP; (4) Senkovskyy, V. et al. *J. Am. Chem. Soc.* 2007, 129, 6626; (5) Bronstein, H. et al. *J. Am. Chem. Soc.* 2009, 131, 12894; (6) Doubina, N. et al. *Macromolecules*, 2009, 42, 7670.

WORKING EXAMPLES

These and other features and advantages may be better understood from the following non-limiting working examples.

The following synthetic examples are illustrative and not intended to be limiting. All reactions were conducted under prepurified nitrogen, using oven-dried and/or flame-dried glassware unless specified. Ice/water, dry ice/acetone were used for 0° and −78° C. baths, respectively. All reagents and chemicals were purchased from commercial sources (e.g., Aldrich Chemical Co., Inc., Fisher Scientific, Acros, etc.) and used without further purification unless stated otherwise. Titration of the Grignard/organolithium reagents was performed following the procedure described by Love, B. E. et al. *J. Org. Chem* 1999, 64, 3755. Reagent grade solvents were dried and/or purified by distillation or else when necessary.

Working Example 1

Synthesis of 3,4-bis(2-(2-butoxyethoxy)ethoxy)thiophene (1)

The synthesis of this monomer was carried out as described in PCT/US09/040257 (Example 1).

Working Example 2

Dihalogenation of 3,4-ethylenedioxythiophene (EDOT)

Bromination of EDOT has been reported in literature by several people. See Aubert, et al., *Macromolecule* 2004, 37(11), 4087. EDOT can be purchased from Aldrich (Cat

83028). A similar procedure using N-Chlorosuccinimde will yield the dichloro derivative.

Working Example 3

Synthesis of poly(3,4-bis(2-(2-butoxyethoxy)ethoxy)thiophene)-alt-3,4-ethylenedioxythiophene) [BEET-alt-EDOT]

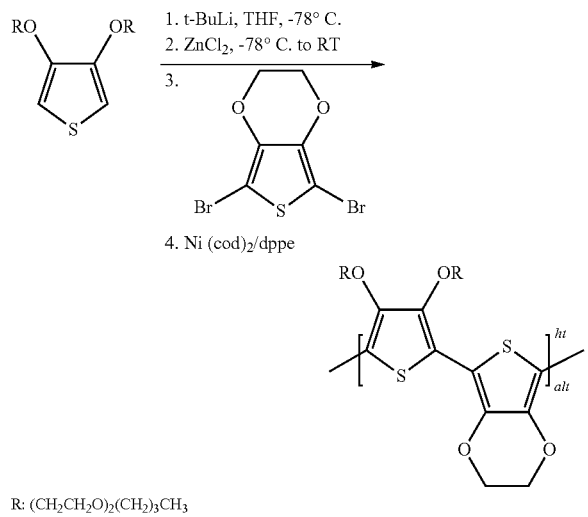

R: (CH₂CH₂O)₂(CH₂)₃CH₃

In this Example, the synthesis of poly(3,4-bis(2-(2-butoxyethoxy)ethoxy)thiophene)-alt-3,4-ethylenedioxythiophene) [BEET-alt-EDOT] was carried. Note WO 2007/059838 (Merck).

A dry 25-mL three-neck round bottom flask was flashed with N₂ and charged with 3,4-bis(2-(2-butoxyethoxy)ethoxy)thiophene (1.07 g, 2.65 mmol) and anhydrous THE (15 mL) was added via syringe. The reaction flask was chilled to −78° C. and t-butyllithium (3.50 mL, 5.50 mmol) was added dropwise. The reaction was stirred for 1 hour at −78° C. and acetone dry ice bath was removed. After 15 minutes of stirring at 0° C., the solution was chilled to −78° C. and stirring continued for 5 minutes. Anhydrous ZnCl₂ (0.76 g, 5.56 mmol) was added in one portion and completely dissolved after 30 minutes of stirring. The cooling bath was removed and the reaction mixture was allowed to warm to ambient temperature. To this reaction mixture 2,5-dibromo-3,4-ethylenedioxythiophene (0.795 g, 2.65 mmol) in THF (5 mL) was added via cannula, followed by addition of 1,2-bis(diphenylphosphino)ethane (dppe) (63.3 mg, 0.159 mmol) and bis(1,5-cyclooctadiene)nickel (0) (Ni(cod)₂) (18.2 mg, 0.066 mmol). The reaction mixture was heated to 65° C. and stirred for 24 hours. The reaction mixture was precipitated into methanol. The polymer was filtered, washed in sequence with more methanol, hexanes, and chloroform. The chloroform fraction was concentrated, re-precipitated in methanol, isolated via filtration, and analyzed by NMR which confirmed the structure.

What is claimed is:

1. A copolymer comprising at least one first thiophene repeat unit and at least one second thiophene repeat unit, said first thiophene repeat unit being different from said second thiophene repeat unit,
    wherein said first thiophene repeat unit and said second thiophene repeat unit each comprise substituents at the 3-position and the 4-position, said substituents comprising an oxygen bonded to the thiophene ring; and
    wherein said copolymer is an alternating copolymer of the first and second thiophene repeat units; and
    wherein said first thiophene repeat unit and said second thiophene repeat unit are connected to each other at the 2-position and the 5-position.

2. The copolymer according to claim 1, wherein said first thiophene repeat unit substituents each comprise a chain of at least five carbons or heteroatoms, and wherein said second thiophene repeat unit substituents each comprise a chain of fewer than five carbons or heteroatoms.

3. The copolymer according to claim 1, wherein the first thiophene repeat unit is a 3,4-dialkoxythiophene.

4. The copolymer according to claim 1, wherein the second thiophene repeat unit is a 3,4-dialkoxythiophene.

5. The copolymer according to claim 1, wherein said first thiophene repeat unit is represented by:

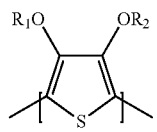

wherein independently R₁ comprises alkyl, optionally substituted alkyl, alkenyl, optionally substituted alkenyl, alkynyl, optionally substituted alkynyl, aryl, optionally substituted aryl; and
    wherein independently R₂ comprises alkyl, optionally substituted alkyl, alkenyl, optionally substituted alkenyl, alkynyl, optionally substituted alkynyl, aryl, optionally substituted aryl.

6. The copolymer according to claim 1, wherein said second thiophene repeat unit is represented by:

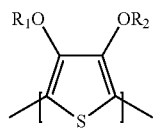

wherein independently R₁ comprises alkyl, optionally substituted alkyl, alkenyl, optionally substituted alkenyl, alkynyl, optionally substituted alkynyl, aryl, optionally substituted aryl; and
    wherein independently R₂ comprises alkyl, optionally substituted alkyl, alkenyl, optionally substituted alkenyl, alkynyl, optionally substituted alkynyl, aryl, optionally substituted aryl.

7. The copolymer according to claim 1, wherein said second thiophene repeat unit is represented by:

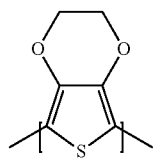

8. The copolymer according to claim 1, said copolymer being an alternating copolymer represented by:

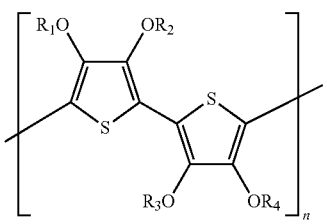

wherein independently R₁ comprises alkyl, optionally substituted alkyl, alkenyl, optionally substituted alkenyl, alkynyl, optionally substituted alkynyl, aryl, optionally substituted aryl;

wherein independently R₂ comprises alkyl, optionally substituted alkyl, alkenyl, optionally substituted alkenyl, alkynyl, optionally substituted alkynyl, aryl, optionally substituted aryl;

wherein independently R₃ comprises alkyl, optionally substituted alkyl, alkenyl, optionally substituted alkenyl, alkynyl, optionally substituted alkynyl, aryl, optionally substituted aryl; and wherein independently R₄ comprises alkyl, optionally substituted alkyl, alkenyl, optionally substituted alkenyl, alkynyl, optionally substituted alkynyl, aryl, optionally substituted aryl.

9. The copolymer according to claim 1, said copolymer being an alternating copolymer represented by:

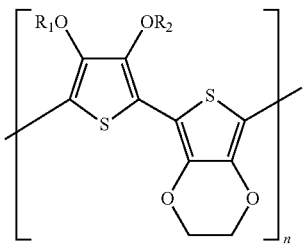

wherein independently R₁ comprises alkyl, optionally substituted alkyl, alkenyl, optionally substituted alkenyl, alkynyl, optionally substituted alkynyl, aryl, optionally substituted aryl; and wherein independently R₂ comprises alkyl, optionally substituted alkyl, alkenyl, optionally substituted alkenyl, alkynyl, optionally substituted alkynyl, aryl, optionally substituted aryl.

10. An ink composition comprising the copolymer of claim 1.

11. A coated substrate comprising the copolymer of claim 1, wherein the copolymer is in doped or undoped form.

12. A device comprising the copolymer of claim 1, wherein the copolymer is in doped or undoped form.

13. An OLED device comprising the copolymer of claim 1 in doped or undoped form.

14. The copolymer of claim 1, wherein the substituents in the second thiophene repeat unit form a substituted or unsubstituted alkylene group.

15. The copolymer of claim 5, wherein $R_1O$ and $R_2O$ are polyethers.

16. The copolymer of claim 5, wherein $R_1O$ and $R_2O$ are (2-(2-butoxyethoxyl)ethoxy).

17. The copolymer of claim 6, wherein $R_1O$ and $R_2O$ are connected by covalent bonds.

18. A method to form the copolymer according to claim 1 comprising:

providing at least one first thiophene monomer, providing at least one second thiophene monomer, said second thiophene monomer being different from said first thiophene monomer, wherein said first thiophene monomer comprises a first functionality at the 2-position and the 5-position, wherein said second thiophene monomer comprises a second functionality at the 2-position and the 5-position, said second functionality being adapted to react with said first functionality, wherein said first thiophene monomer and said second thiophene monomer each comprise substituents at the 3-position and the 4-position, said substituents comprising an oxygen bonded to the thiophene ring; and reacting said at least one first thiophene monomer and said at least one second thiophene monomer in the presence of a transition metal.

* * * * *